United States Patent
Kakutani et al.

(10) Patent No.: US 7,389,805 B2
(45) Date of Patent: Jun. 24, 2008

(54) BONDING ARM SWINGING TYPE BONDING APPARATUS

(75) Inventors: Osamu Kakutani, Oume (JP); Yutaka Kondo, Tachikawa (JP); Yoshihiko Seino, Musashimurayama (JP)

(73) Assignee: Kabushiki Kaisha Shinkawa, Tokyo (JP)

(*) Notice: Subject to any disclaimer, the term of this patent is extended or adjusted under 35 U.S.C. 154(b) by 0 days.

(21) Appl. No.: 11/061,272

(22) Filed: Feb. 17, 2005

(65) Prior Publication Data
US 2005/0184127 A1    Aug. 25, 2005

(30) Foreign Application Priority Data
Feb. 20, 2004    (JP)    ............... 2004-044576

(51) Int. Cl.
  *B32B 37/00*    (2006.01)
  *B32B 39/00*    (2006.01)
  *B23K 37/02*    (2006.01)

(52) U.S. Cl. ................ 156/391; 228/4.5; 228/904

(58) Field of Classification Search ................ 156/391, 156/580, 580.1, 580.2; 318/254, 138; 228/4.1, 228/4.5, 45, 904
See application file for complete search history.

(56) References Cited

U.S. PATENT DOCUMENTS 5,080,276 A * 1/1992 Kashima et al. ............... 228/4.5
5,114,244 A * 5/1992 Dunham et al. ............. 384/103
5,538,558 A * 7/1996 Ookouchi et al. ........... 118/423

FOREIGN PATENT DOCUMENTS

JP    2003-347349    12/2003

* cited by examiner

*Primary Examiner*—Philip Tucker
*Assistant Examiner*—Sing P. Chan
(74) *Attorney, Agent, or Firm*—William L. Androlia; H. Henry Koda

(57) ABSTRACT

A bonding arm swinging type bonding apparatus that has a rotational center 13 of the bonding arm 1 beneath the bonding arm. The rotating shaft parts 11 of circular arc form rotary motors 10 that rotate about the rotational center 13 of the bonding arm 1 are attached to the bonding arm 1, and the rotating shaft parts 21 of circular arc form air bearings 20 that rotate about this rotational center 13 are provided so that the rotating shaft parts of the circular arc form air bearings 20 are rotatable as a unit with the rotating shaft parts 11 of the rotary motors 10.

4 Claims, 1 Drawing Sheet

BONDING ARM SWINGING TYPE BONDING APPARATUS

BACKGROUND OF THE INVENTION

1. Technical Field

The present invention relates to a bonding arm swinging type bonding apparatus in which the swinging center of the bonding arm during bonding can be set on a bonding surface.

2. Description of the Related Art

Japanese Patent Application Laid-Open (Kokai) No. 2003-347349, for instance, discloses an example of a bonding arm swinging type bonding apparatus. In this bonding arm swinging type bonding apparatus, the bonding head is provided so that it can be maintained in a position that is higher than the work plane and so that the bonding arm need not be lengthened even in cases where the bonding area is broad. Thus, in this bonding apparatus, a high-speed operation can be performed while suppressing any increase in the inertia of the bonding arm.

More specifically, the above-described prior art bonding apparatus comprises a bonding arm which has a capillary attached to a tip end thereof, a driving motor which is attached to the rear end portion of this bonding arm in order to drive the bonding arm, and a bonding head in which a circular arc form window structure is formed so that the window supports supporting portions that are disposed on both sides of the bonding arm. The center of the circular arc of the window is disposed on the plane of the bonding surface, and the supporting portions of the bonding arm move along the circular arc shape in the circular arc form window of the bonding head.

In the above-described prior art, a bonding arm that is short in length can be used. Accordingly, this bonding apparatus can reduce the inertial moment of the bonding arm. However, since the driving motor is installed on the rear end portion of the bonding arm, which is apart from the rotational center of the bonding arm, there are limitations to the reduction in the inertial moment that can be achieved.

BRIEF SUMMARY OF THE INVENTION

Accordingly, the object of the present invention is to provide a bonding arm swinging type bonding apparatus in which a remarkable reduction in inertial moment is achievable and which is able to make a high-speed operation of the boding arm.

The above object is accomplished by a unique structure of the present invention for a bonding arm swinging type bonding apparatus that has a bonding arm rotational center beneath the bonding arm; and in the present invention,

- a first rotating shaft part, which is the rotating shaft part of a circular arc form rotary motor and rotates about the rotational center of the bonding arm, is attached to the bonding arm; and
- a second rotating shaft part, which is the rotating shaft part of a circular arc form bearing and rotates about the rotational center of the rotary motor, is provided so that the second rotating shaft part is rotatable as a unit with the first rotating shaft part of the rotary motor.

In the above structure of the bonding arm swinging type bonding apparatus of the present invention, the bearing is an air bearing, a rolling bearing or a sliding bearing.

Since the rotational centers of the rotary motor and air bearing, rolling bearing or sliding bearing are provided at the rotational center of the bonding arm, the inertial moment of the bonding arm is extremely low and a significantly high-speed operation of the bonding arm is possible.

DETAILED DESCRIPTION OF THE INVENTION

Figure 1:
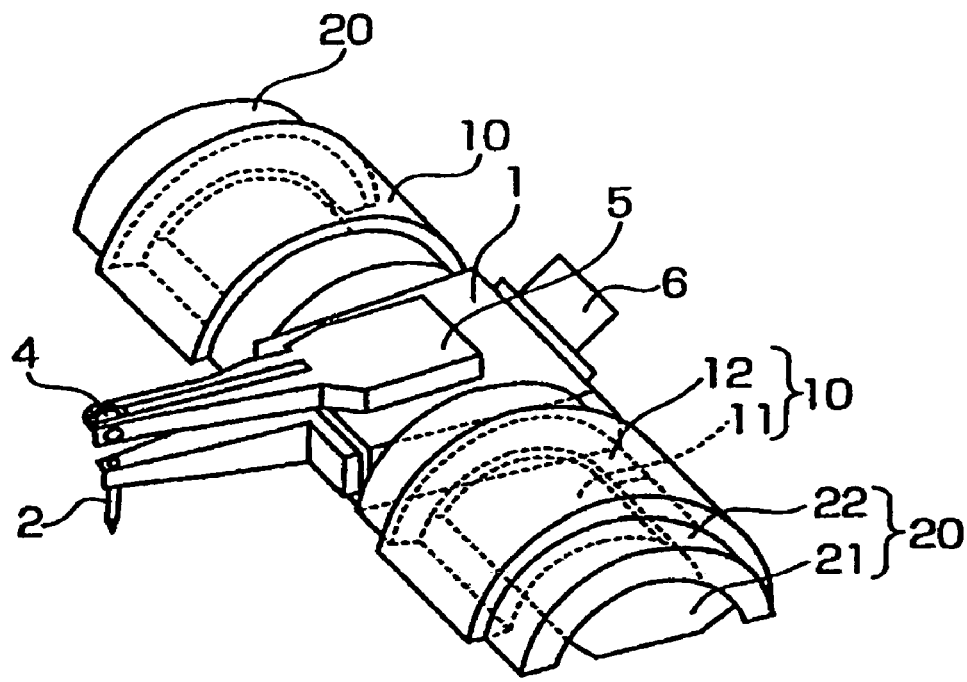
FIG. 1 is a perspective view of the essential portion of one embodiment of the bonding arm swinging type bonding apparatus of the present invention.

One embodiment of the present invention will be described with reference to FIGS. 1 and 2.

A capillary 2 is attached to the tip end portion of a bonding arm 1, and a wire 3 wound on a wire spool (not shown) passes through the capillary 2. A clamper arm 5, which has a wire clamper 4 that clamps the wire 3, is provided above the bonding arm 1, and this clamper arm 5 is attached to the bonding arm 1. The reference numeral 6 is a sensor scale.

Circular arc form rotary motors 10 are disposed on both ends of the bonding arm 1, and the rotating shaft parts 11 of the rotary motors 10 are attached to the side surfaces of the bonding arm 1. The rotating shaft parts 11 of the rotary motors 10 is in a shape of a circular arc that is smaller than a semicircle, and their rotational centers 13 are positioned within the bonding surface 14 during bonding. The rotating shaft parts 11 of the rotary motors 10 are held by attraction to the fixing portions 12 of the rotary motors 10 by a magnetic force of the rotary motors 10.

Circular arc form air bearings 20 are disposed on both sides of the rotary motors 10. The rotating shaft parts 21 of the air bearings 20 are integrally attached to the rotating shaft parts 11 of the rotary motors 10, and the fixing portions 22 of the air bearings 20 are integrally attached to the fixing portions 12 of the rotary motors 10. The rotational centers of the rotating shaft parts 21 of the air bearings 20 are the rotational centers 13 of the rotating shaft parts 11 of the rotary motors 10.

Figure 2:
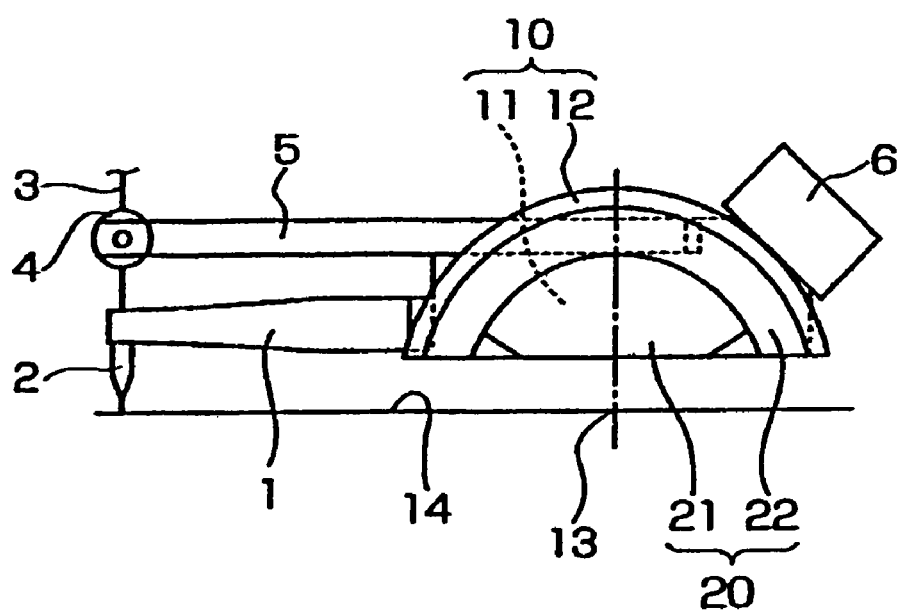
FIG. 2 is a side view thereof.

Though not shown in FIG. 1 or 2, the fixing portions 12 of the rotary motors 10 are fastened to the bonding head, the upper surface of the bonding head is fastened to an XY table that is driven in the directions of the X and Y axes, and the XY table is fastened to the ceiling part of the stand of the bonding apparatus.

In the above structure, when the bonding apparatus is stopped (off), the rotating shaft parts 11 of the rotary motors 10 are held by the magnets of the fixing portions 12. Thus, the bonding arm 1 (which forms an integral unit with the rotating shaft parts 11 of the rotary motors 10) and the rotating shaft parts 21 of the air bearings 20 are also held by the fixing portions 12 of the rotary motors 10.

On the other hand, when the bonding apparatus is in operation (on), and the capillary 2 is moved vertically, air that overcomes the attractive force created by the magnetic force of the rotary motors 10 is supplied to the air bearings 20, so that the rotating shaft parts 21 of the air bearings 20 and the rotating shaft parts 11 of the rotary motors 10 are put into a floating state. Accordingly, when an operating current is supplied to the rotary motors 10, the rotating shaft parts 11 of the rotary motors 10, the rotating shaft parts 21 of the air bearings 20 and the bonding arm 1 swing about the rotational center 13. As a result of the swinging of the bonding arm 1, the wire 3 passing through the capillary 2 is bonded to the workpiece.

As seen from the above, according to the present invention, in a bonding arm swinging type bonding apparatus which has a rotational center 13 of the bonding arm 1 located beneath this bonding arm 1, the rotational shaft parts (or first rotational shaft parts) 11 of the circular arc form rotary motors 10 that rotate about the rotational center 13 of the bonding arm 1 are attached to the bonding arm 1, and the rotating shaft parts (or second rotational shaft parts) 21 of the circular arc form air bearings 20 that rotate about the rotational center 13 are provided so that the (second) rotating shaft parts are rotatable as a unit with the (first) rotating shaft parts 11 of the rotary motors 10. In other word, the rotational centers of the rotary motors 10 and air bearings 20 are provided at the rotational center 13 of the bonding arm 1; accordingly, the inertial moment of the bonding arm is extremely low, and a significantly high-speed operation of the bonding arm can be accomplished.

In the above-described description, air bearings are used as the bearings. However, it goes without saying that the bearing used can be rolling bearings, sliding bearings, etc.

The invention claimed is:

1. A bonding arm swinging type bonding apparatus comprising:
   a bonding arm having a pivot point at a rotational center of the bonding arm beneath said bonding arm,
   a first rotating shaft part, having a cross-sectional shape of a circular arc form less than a semicircle, which is a rotating shaft part of a circular arc form rotary motor and rotates about said pivot point, and is coupled to both ends of said bonding arm, and
   a second rotating shaft part, having a cross-sectional shape of a circular arc form less than a semicircle, which is a rotating shaft part of a circular arc form bearing and rotates about said pivot point and is provided rotatably as a unit with said first rotating shaft part at both sides of said circular arc form rotary motor.

2. The bonding arm swinging type bonding apparatus according to claim 1, wherein said circular arc form bearing is an air bearing.

3. A bonding arm, swinging type bonding apparatus comprising:
   a bonding arm having a pivot point at a rotational center beneath said bonding arm,
   a first rotating shaft part, having a cross-sectional shape of a circular arc form less than a semicircle, which is a rotating shaft part of a circular arc form rotary motor and rotates about said pivot point and is coupled to both ends of said bonding arm;
   a second rotating shaft part, having a cross-sectional shape of a circular arc form less than a semicircle, which is a rotating shaft part of a circular arc form bearing and rotates about said pivot point and is provided rotatably as a unit with said first rotating shaft part at both sides of said circular arc form rotary motor; and
   wherein said circular arc form bearing is an air bearing.

4. A bonding arm swinging type bonding apparatus comprising:
   a bonding arm having a pivot point at a rotational center beneath said bonding arm,
   a first rotating shaft part, having a cross-sectional shape of a circular arc form less than a semicircle, which is a rotating shaft part of a circular arc form rotary motor and rotates about said pivot point and is coupled to both ends of said bonding arm;
   a second rotating shaft part, having a cross-sectional shape of a circular arc form less than a semicircle, which is a rotating shaft part of a circular arc form bearing and rotates about said pivot point and is provided rotatably as a unit with said first rotating shaft part at both sides of said circular arc form rotary motor; and
   wherein said circular arc form bearing is one selected from the group consisting of an air bearing, a rolling bearing and a sliding bearing.

* * * * *